March 17, 1970 S. GOLDSCHMIED 3,500,536

PROCESS FOR FINISHING SOLDER JOINTS ON A CIRCUIT BOARD

Filed Nov. 17, 1966 2 Sheets-Sheet 1

INVENTOR.
SANDOR GOLDSCHMIED
BY
Christie, Parker & Hale
ATTORNEYS.

March 17, 1970 S. GOLDSCHMIED 3,500,536
PROCESS FOR FINISHING SOLDER JOINTS ON A CIRCUIT BOARD
Filed Nov. 17, 1966
2 Sheets-Sheet 2
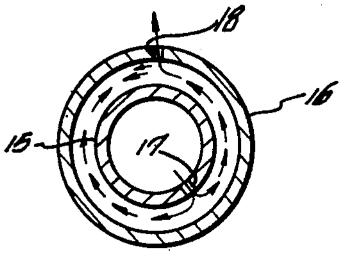
FIG. 5A
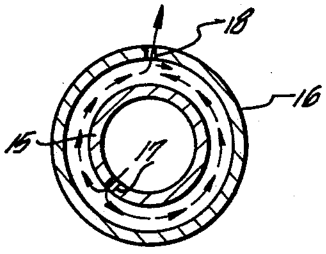
FIG. 5B
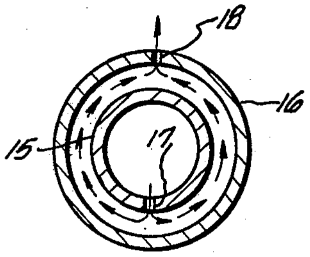
FIG. 5C
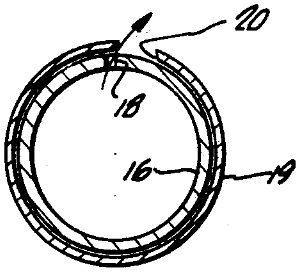
FIG. 6A
FIG. 6B
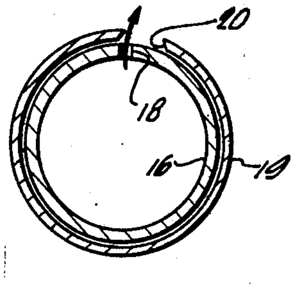
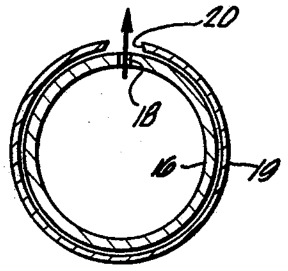
FIG. 6C
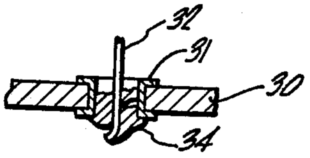
FIG. 3A
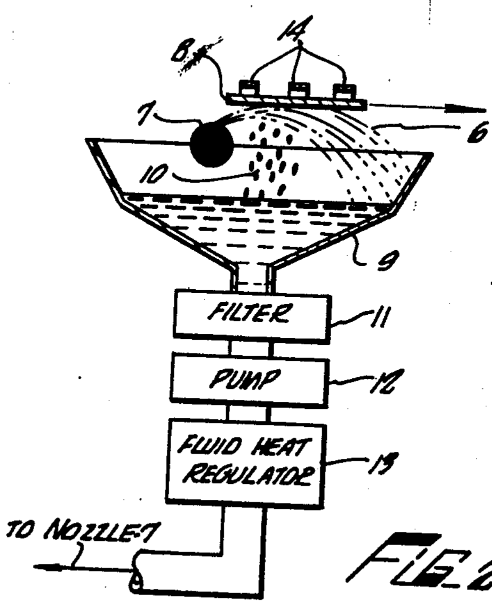
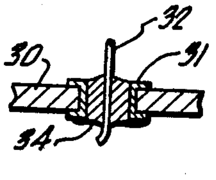
FIG. 3B
FIG. 2
INVENTOR.
SANDOR GOLDSCHMIED
BY Christie, Parker & Hale
ATTORNEYS.

United States Patent Office 3,500,536
Patented Mar. 17, 1970

3,500,536
PROCESS FOR FINISHING SOLDER JOINTS ON A CIRCUIT BOARD

Sandor Goldschmied, Anaheim, Calif., assignor to Burroughs Corporation, Detroit, Mich., a corporation of Michigan Filed Nov. 17, 1966, Ser. No. 595,137
Int. Cl. H01h 69/02
U.S. Cl. 29—623 12 Claims

ABSTRACT OF THE DISCLOSURE

A process for installing electrical components on a printed circuit board is disclosed, which includes a finishing step comprising the application of a fluid wave to the underside of the board after passing it through a wave of liquid solder. The temperature of the fluid is above the melting point of the solder. A nozzle arrangement for producing fluid waves is also disclosed. This nozzle arrangement is particularly well suited for use in the process because it permits adjustment of the characteristics of the wave produced.

This invention relates to the installation of components on a printed circuit board and, more particularly, to a process for finishing printed circuit boards after being exposed to solder, in order to secure and electrically connect the components, and to apparatus especially useful in practicing the process.

In installing components on a printed circuit board, the leads of the components are inserted through holes in the board lined with electrically conductive eyelets or plated through holes on a printed circuit board to which solder adheres. The eyelets are electrically connected to the printed circuits etched on the board. After all the components are mounted on the board, its underside (i.e., the side without components) is exposed to a wave of melted solder. The solder adheres to the eyelets and the component leads, thereby filling the spaces between them. For the circuit board itself, a material is used to which the solder will not adhere. Consequently, individual solder joints are formed at each hole between the conductive eyelet and the lead inserted through it.

This process for producing solder joints between components and a circuit board can be completely automated, but unfortunately, results in a relatively high number of bad solder joints and short circuits. Close examination has shown that often the solder does not penetrate very far into the holes in the circuit board and is often not bonded to the surface of the eyelets or plated through holes and the leads, as would be required for a really good solder joint. Furthermore, at the completion of the process, short circuits resulting from solder that runs across the circuit board between adjoining connections must be removed by hand. This demands a large expenditure of human labor.

According to the invention, the solder joints between the leads of components mounted on a circuit board and the eyelets on the board are substantially improved by subjecting the circuit board to a finishing process after the solder forming the joint is applied to the board. The finishing process involves the step of applying a fluid, preferably as a wave, to the soldered surface of the board while the solder is in a liquid state. The finishing fluid, which does not mix or chemically react with the solder or the board, is maintained at a temperature above the melting point of the solder. As a result, the liquid solder is drawn deeper into the eyelets; any flux and air trapped in the joint are released; and a good bond between the solder, on the one hand, and the surface of the component leads and the eyelets, on the other hand, is established. In addition, if there is also printed circuitry on the underside of the board to which the solder adheres, the finishing fluid removes the excess solder, leaving an even solder coating over the printed circuitry.

A special nozzle arrangement is provided that is particularly well suited for adjusting the direction and amount of the flow as well as the pattern and thickness of the fluid wave in the finishing process. The fluid to be ejected from the nozzle arrangement is coupled under pressure to an inner cylinder having closely spaced openings in a line along its length. An outer cylinder also having closely spaced openings in a line along its length is situated concentric with the inner cylinder. The cylinders are so dimensioned that an annular passage is defined between their surfaces. The fluid flows from the holes in the inner cylinder through the annular passage to the holes in the outer cylinder, from which it is ejected as a wave. The relative angular position of the holes in the inner and outer cylinders about the cylindrical is adjustable, with the result that the direction of propagation of the wave from the holes in the outer cylinder and the wave pattern can be controlled. A jacket having a slit along its length fits tightly over the outer cylinder. The slit of the jacket is adjustable relative to the holes in the outer cylinder. By partially covering the holes of the outer cylinder with the jacket, the direction of propagation of the wave and its pattern can be further and independently controlled, while the thickness of the wave and the amount of fluid ejected can also be regulated.

These and other features of the invention are considered further in the following detailed description taken in conjunction with the drawings, in which:

FIG. 2 is a schematic diagram representing a process according to the invention for finishing the solder joints between components and eyelets in a circuit board;

FIGS. 3A and 3B are side views in section illustrating a solder joint before and after the process of FIG. 2, respectively;

Figure 4B:
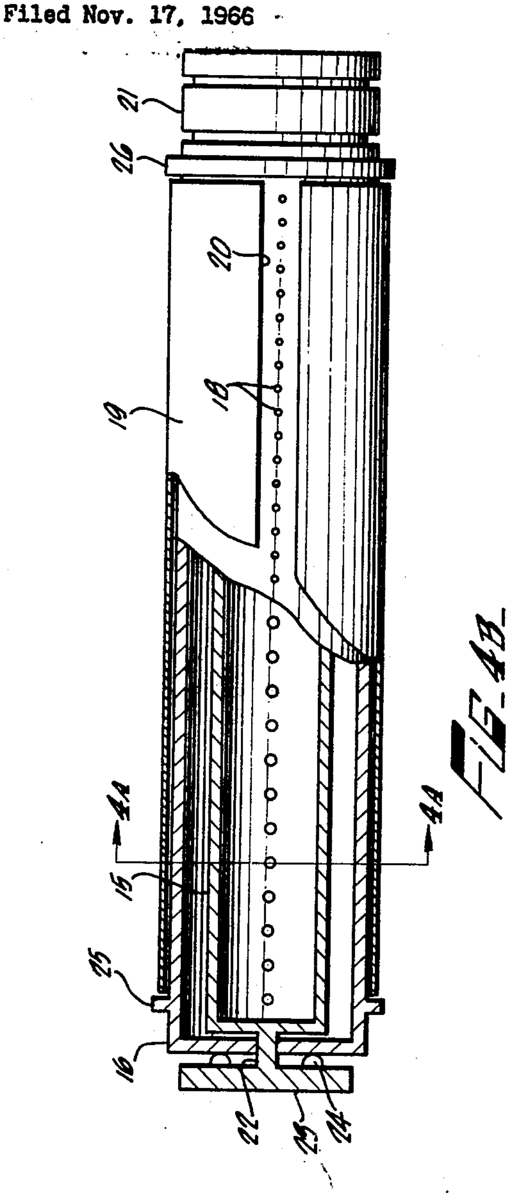
FIGS. 4A and 4B are front and side elevation views, respectively, of a nozzle arrangement particularly well suited for carrying out the process represented in FIG. 2.
Figure 4A:
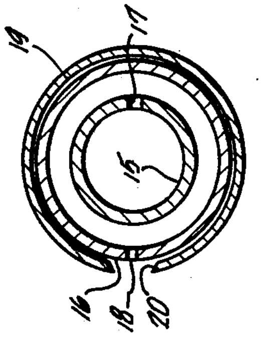

FIGS. 5A, 5B, and 5C are diagrams representing the fluid flow between the inner and outer cylinders of the nozzle arrangement of FIGS. 4A and 4B; and FIGS. 6A, 6B, and 6C are diagrams representing the fluid flow through the holes in the outer cylinder and the jacket of the nozzle arrangement of FIGS. 4A and 4B.

Figure 1:
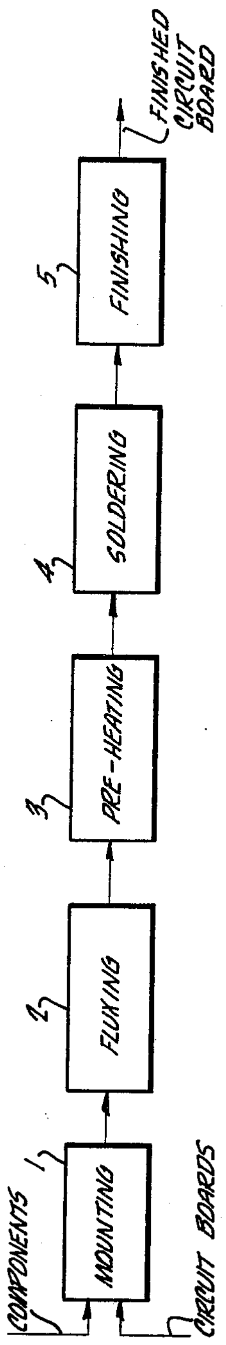
FIG. 1 is a functional block diagram illustrating the steps involved in installing components on a printed circuit board.

Reference is now made to FIG. 1, which shows the steps of a process for installing components on a printed circuit board. As represented by a block 1, the components are first mounted on the circuit board either manually or by machine so their leads extend through holes in the board surrounded by electrically conductive eyelets. The eyelets are plated with a conductor, such as gold, to which solder adheres. Flux is applied to the board to clean the surfaces to be soldered. This is represented by a block 2. The board is then preheated preparatory to the application of a solder wave to the board, as represented by a block 3. Next, as represented by a block 4, the underside of the board is passed through a wave of liquid solder. The solder adheres to the eyelets and to the component leads, thereby forming solder joints between them. As represented by a block 5, the final step is to finish the circuit board according to the invention. This is accomplished by exposing the underside of the board to a finishing fluid having a temperature above the melting point of the solder. A finishing fluid is selected that is immiscible with the melted solder and does not chemically react with it or the board, for example, silicon oil. The solder spreads up through and fills the space between the eyelets and the leads to form good electrical and physical connections between them. Moreover, trapped flux and air is released from the joints. Typically for solder with a melting point of about 360° F., the finishing fluid is maintained at a temperature between 400° and 420° F. After the circuit board cools, the finishing fluid is rinsed off. The characteristics of the finished solder joints are controlled by adjusting the temperature and amount of the fluid, the force with which the fluid hits the circuit board, the angle at which the fluid impinges on the circuit board, the thickness of the fluid wave, and the length along which the fluid wave is in cotnact with the circuit board.

Equipment used to apply the fluid to a circuit board in the course of the finishing step is represented schematically in FIG. 2. A wave 6 of fluid is produced by a nozzle 7, which is discussed in detail in connection with FIGS. 4A and 4B. A circuit board 8 with components 14 mounted on its topside is transported by conventional conveyor means not shown through wave 6 in the direction indicated by the arrow. The underside of board 8, which has previously been exposed to a bath of melted solder, therefore, comes into contact with the fluid wave produced by nozzle 7. The fluid wave remains in contact with the surface of board 8 for a predetermined distance and then drops back into a pan 9 for collection and recirculation. Preferably, nozzle 7 is adjusted to produce a wave that impinges on the surface of circuit board 8 at an angle of between 11° and 13°. In addition to forming good solder joints between the eyelets and the component leads, the wave of finishing fluid removes the excess solder from the surface of the board and leaves an even solder coating over any printed circuits that may be on the underside of the board. This solder, represented in FIG. 2 by drops 10, passes through wave 6 and into pan 9. The fluid collected by pan 9 passes through a filter 11 that removes the solder particles. A pump 12 forces the fluid to recirculate through a fluid heat regulator 13 to nozzle 7. The temperature of the fluid wave is controlled by regulator 13.

FIGS. 3A and 3B are close-up views of a typical solder joint before and after the finishing process, respectively. A gold-plated eyelet 31 surrounds an opening through a circuit board 30. A component lead 32 is inserted into the eyelet in the course of the mounting step represented by block 1 in FIG. 1. After the underside of circuit board 30 is exposed to melted solder in the step represented by block 4 in FIG. 1, the melted solder 34 spreads only part way through eyelet 31, as represented in FIG. 3A, and is not completely bonded to its surface and the surface of lead 32. During the finishing process, however, the solder spreads further through eyelet 31 and is bonded to its surface and the surface of lead 32, thereby forming a good solder joint, as represented in FIG. 3B.

In FIGS. 4A and 4B, a nozzle arrangement is shown that is particularly well suited for use as nozzle 7 in the finishing process illustrated in FIG. 2. The arrangement comprises an inner cylinder 15 and an outer cylinder 16 that are concentric with one another. A fitting 21 is provided at one end of the arrangement for connection to the source of fluid under pressure. (With reference to the equipment of FIG. 2, the source of fluid would be regulator 13.) A line of openings 17 extends along the length of inner cylinder 15 and a line of openings 18 extends along the length of outer cylinder 16. Inner cylinder 15 is open at one end. Fluid passing through fitting 21 enters and flows through cylinder 15. As the fluid flows, it passes through openings 17. Openings 17 have diameters of increasing size moving away from fitting 21 so as to compensate for the decreasing fluid pressure along the axis of cylinder 16. Preferably, openings 17 are graduated in diameter such that the flow rate from each opening is the same and no back wave is produced at the end of the cylinder.

Outer cylinder 16 is completely sealed so that fluid can only enter it through openings 17. The diameter of cylinder 16 is substantially larger than the diameter of cylinder 15 so an annular passage is defined by their side walls. Fluid passing into the annular passage from openings 17 flows to openings 18 and is ejected therefrom. Cylinder 15 is rotatably mounted inside of cylinder 16 and connected by a shaft 22 to a knob 23 located outside of the nozzle arrangement. A seal 24 is situated between knob 23 and the end surface of cylinder 16. By rotating knob 23, the relative position between openings 17 and openings 18 is changed.

Reference is made to FIGS. 5A, 5B, and 5C for diagrams illustrating how the relative positions of openings 17 and 18 affect the direction of the fluid wave produced by the nozzle arrangement. The fluid passing through openings 17 flows through the annular passage to openings 18 via two paths. When the angle between a radius through openings 17 and a radius through openings 18 is less than 180°, as illustrated in FIGS. 5A and 5B, one path of fluid flow is shorter than the other. The fluid traversing the shorter path undergoes a smaller pressure drop than the fluid traversing the longer path. Consequently, the fluid is ejected from openings 18 in a direction forming an angle with the radius of the cylinders, the extent of which depends upon the differential distance of the two paths between openings 17 and openings 18. When the angle between the radii of openings 17 and 18 is 180°, the fluid travels the same distance in traversing the two paths and is ejected radially from openings 18.

A jacket 19 (FIGS. 4A and 4B) having a slot 20 along its length fits snugly around outer cylinder 16. The edges of slot 20 are tapered inwardly. Flanges 25 and 26 on cylinder 16 serve to maintain the axial position of jacket 19 relative to cylinder 16. The position of slot 20 with respect to openings 18 can be adjusted by rotating jacket 19. Further control of the direction of the fluid ejected from the nozzle arrangement can be effected by changing the portion of openings 18 covered by jacket 19. In addition, this changes the amount of fluid ejected, as well as the thickness and pattern of the wave produced by the nozzle arrangement.

Reference is now made to FIGS. 6A, 6B, and 6C, in which various positions of jacket 19 with respect to cylinder 16 are shown. In FIG. 6A, jacket 19 almost completely covers openings 18 with the result that only a small amount of fluid is ejected, and the ejected fluid is deflected to the side by the tapered edge of slot 20. FIG. 6B shows jacket 19 covering about one-half of opening 18. In this position more fluid is ejected but, due to the tapered edge of slot 20, the ejected fluid is still deflected to the side. In FIG. 6C, on the other hand, slot 20 is centered with respect to openings 18 and a maximum of fluid is ejected in a direction along the radial line. The directional control illustrated in FIGS. 6A, 6B, and 6C is independent of and does not take into account the control of the direction that may be introduced by adjusting the relative positions between openings 17 and openings 18 as described in connection with FIGS. 5A, 5B, and 5C. Thus, with jacket 19 located in the position shown in FIG. 6C, the direction of the fluid ejected by the nozzle arrangement can still be changed by operating knob 23.

Although the nozzle arrangement of FIGS. 4A and 4B is particularly well suited for use in carrying out the finishing process of the invention because the characteristics of the fluid wave produced thereby are susceptible of fine control, it can be employed in other applications as well that call for a fluid wave, such as the soldering step of FIG. 1. Similarly, the fluid can be applied to the circuit board by other means in the finishing process.

In the illustrated embodiment, the circuit board to be finished is exposed to a wave of finishing fluid, as produced for example by the nozzle arrangement of FIGS. 4A and 4B, because use of a wave is particularly well suited for automated operation. The finishing process can be carried out, however, by emersing the circuit board to be finished in a bath of finishing fluid at the requisite temperature or by other techniques of exposing the surface of the board to the finishing fluid.

If the circuit board is exposed to the finishing fluid while the liquid solder on the board is still at a higher temperature than the finishing fluid so heat transfer takes place from the solder to the finishing fluid, a particularly effective finishing operation may be accomplished. In such case, the drop in the temperature of the solder may increase the surface tension of the solder on the surface of the board and the capillary action of the solder in the holes, thereby intensifying the results enumerated above.

What is claimed is:

1. A process for establishing solder joints between electrical components and electrically conductive eyelets lining holes in a printed circuit board comprising in the order recited the steps of: mounting the components on one side of the circuit board such that their leads pass through eyelets in the circuit board; applying liquid solder to the other side of the circuit board; and applying to the other side of the circuit board a fluid at a temperature above the melting point of the solder, the fluid being immiscible and chemically nonreactive with the solder and the board.

2. The process of claim 1, in which the temperature of the fluid applied to the other side of the circuit board is lower than the actual tempertaure of the solder on the board at the time the fluid is applied.

3. A process for installing electrical components on a printed circuit board comprising in the order recited the steps of: inserting the leads of the electrical components through electrically conductive eyelets in the circuit board; exposing one surface of the circuit board to a wave of liquid solder; and exposing the one surface of the circuit board to a wave of fluid, the temperature of which lies above the melting point of the solder, the fluid being immiscible and chemically nonreactive with the solder and the board.

4. The process of claim 3, in which the wave of fluid impinging upon the circuit board forms an angle with the surface of the circuit board between 11° and 13°.

5. The process of claim 3, in which the one surface of the circuit board is exposed to the fluid over a sufficient length to cause the liquid solder to fill the conductive eyelets completely.

6. The process of claim 3, in which the temperature of the fluid waves lies below the actual temperature of the solder on the circuit board at the time of its exposure to the fluid wave.

7. The process of claim 6, in which the circuit board is disposed in a horizontal position during exposure to the wave of liquid solder and the wave of fluid and the underside of the circuit board is exposed to the wave of fluid.

8. The process of claim 1, in which the circuit board is disposed in a horizontal position while the liquid solder and fluid are applied thereto and the liquid solder and fluid are applied to the underside of the board.

9. A process for finishing a printed circuit board having holes lined with electrically conductive eyelets and at least one side surface with printed circuitry on it comprising the steps of: mounting components on the other side of the circuit board such that their leads pass through the eyelets; applying liquid solder to the one side of the circuit board; and applying to the one side of the circuit board a fluid at a temperature above the melting point of the solder, the fluid being immiscible and chemically nonreactive with the solder and the board.

10. The process of claim 9, in which the circuit board is disposed in a horizontal position while the liquid solder and the fluid are applied thereto, the liquid solder is applied to the circuit board as a wave that contacts the underside thereof and the fluid is applied to the circuit board as a wave that contacts the underside thereof.

11. A process for finishing a printed circuit board having openings through which component leads are inserted and in which liquid solder is deposited comprising the step of exposing the liquid solder on the circuit board to a fluid at a temperature between the melting point of the solder and the actual temperature of the solder on the board, the fluid being immiscible and chemically nonreactant with the liquid solder and the board.

12. The process of claim 11, in which during the exposure of the liquid solder on the circuit board to the fluid the circuit board is disposed in a horizontal position such that the fluid is underneath the liquid solder.

References Cited

UNITED STATES PATENTS

| | | | |
|---|---|---|---|
| 595,705 | 12/1897 | Fellows | 228—20 |
| 3,218,193 | 11/1965 | Isaacson | 228—37 X |
| 3,298,588 | 1/1967 | Shomphe | 228—20 |

JOHN F. CAMPBELL, Primary Examiner

U.S. Cl. X.R.

29—471.1, 487; 228—20, 37